(12) United States Patent
Takemoto

(10) Patent No.: US 6,573,519 B1
(45) Date of Patent: Jun. 3, 2003

(54) ELECTRON BEAM EXPOSURE APPARATUS, ADJUSTING METHOD, AND BLOCK MASK FOR ADJUSTMENT

(75) Inventor: Akio Takemoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/651,469

(22) Filed: Aug. 30, 2000

(30) Foreign Application Priority Data

Oct. 29, 1999 (JP) ............................................ 11-308796

(51) Int. Cl.[7] ............................ G21K 5/10; H01J 37/08
(52) U.S. Cl. ................................ 250/492.22; 250/492.21
(58) Field of Search ........................ 250/492.21, 492.2, 250/281, 288, 310, 492.3, 492.22

(56) References Cited

U.S. PATENT DOCUMENTS

| | | | |
|---|---|---|---|
| 5,099,133 A | 3/1992 | Yamada | |
| 5,105,089 A | 4/1992 | Yamada | 250/492.2 |
| 5,148,033 A | 9/1992 | Yamada et al. | |
| 5,334,845 A | 8/1994 | Wakabayashi et al. | 250/492.2 |
| 5,428,203 A | 6/1995 | Kusunose | 219/121.25 |
| 5,757,409 A | 5/1998 | Okamoto et al. | |
| 5,886,357 A | 3/1999 | Kojima | |
| 5,912,467 A | 6/1999 | Okino | 250/491.1 |
| 6,034,376 A | 3/2000 | Ema | |

FOREIGN PATENT DOCUMENTS

| | | |
|---|---|---|
| JP | 3-119717 | 5/1991 |
| JP | 10-255712 | 9/1998 |

OTHER PUBLICATIONS

German Office action dated May 3, 2002 for corresponding case.
English summary of Korean Office Action for corresponding Korean Application No. 10-2000-0050882.

Primary Examiner—John R. Lee
Assistant Examiner—K Fernandez
(74) Attorney, Agent, or Firm—Christie, Parker & Hale, LLP

(57) ABSTRACT

This adjusting method can determine the precise deflection amount of mask deflectors corresponding to each aperture pattern by precisely measuring the position of the beam deflected by the mask deflectors in relation to that of each aperture pattern in an electron beam exposure apparatus, comprising an electron gun, a block mask, plural mask deflectors that deflect the electron beam so as to pass through one of the plural aperture patterns selectively, convergent devices that converge the electron beam onto a specimen, and deflectors that deflect the electron beam on the specimen. The electron beam exposure apparatus has the ability to expose the patterns corresponding to the selected aperture patterns, at one time, and in which the plural aperture patterns are square or rectangular and arranged in a matrix form, each aperture pattern has a square or rectangular maximum aperture area that limits the area in which each aperture is formed, the block mask has at least one adjusting aperture pattern equipped with independent apertures of the same shape arranged along the opposite sides of the maximum aperture area, and the mask deflectors are adjusted so that the intensity of the beam, which is radiated onto the specimen, at the portion of the independent apertures of the same shape arranged along the opposite sides of the adjusting aperture pattern, is uniform and maximum.

6 Claims, 7 Drawing Sheets

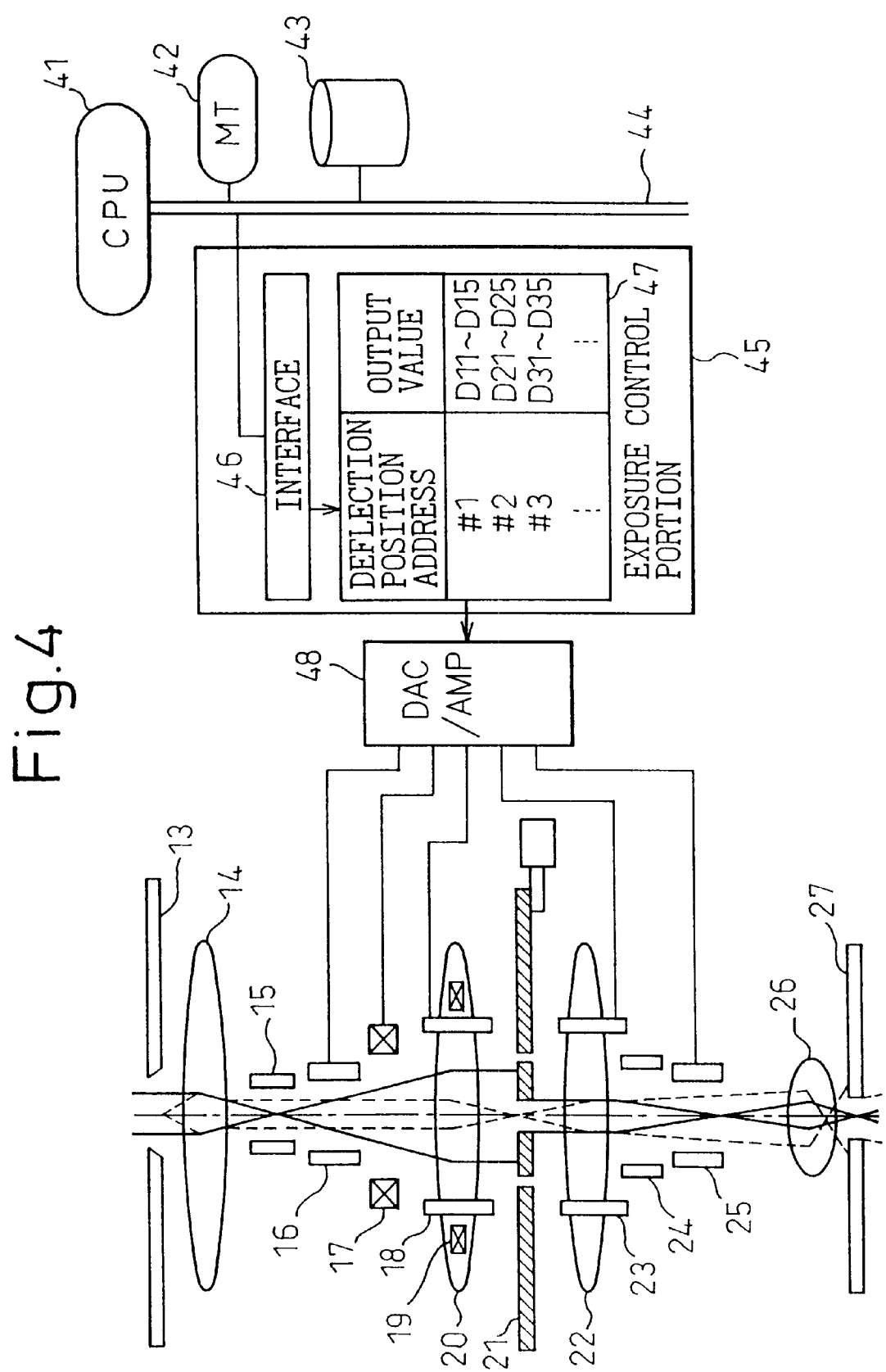

ELECTRON BEAM EXPOSURE APPARATUS, ADJUSTING METHOD, AND BLOCK MASK FOR ADJUSTMENT

BACKGROUND OF THE INVENTION

The present invention relates to an electron beam exposure apparatus of a block exposure type, an adjusting method, and a block mask for the adjustment or, in particular, to the adjustment of a mask deflector to select a pattern of the block mask.

There is a general trend that the density of semiconductor integrated circuits increases depending on advances in micro-machining technology, and the performance required for the micro-machining technology becomes more and more severe. Particularly, in exposure technology, the limit of the optical exposure technology used for devices such as a conventional stepper has been reached. The electron beam exposure technology may be used instead of the optical exposure technology for the advanced micro-machining technology.

There are several types of the electron beam exposure apparatuses such as the variable rectangle exposure type, the block exposure type, and the multibeam exposure type. The present invention relates to the block exposure type. In the block exposure type, a repetitive figure is exposed by integrating unit patterns generated at one time by an electron beam passing through a transmission mask having unit patterns of the repetitive figure.

FIG. 1 illustrates a configuration of a beam radiation system of the block exposure type electron beam exposure apparatus. In FIG. 1, reference number 11 refers to an electron gun that generates an electron beam, 12 to a first convergent lens that forms the electron beam from the electron gun 11 into a parallel beam, 13 to an aperture that shapes the parallel beam passing through into a specified shape, 14 to a second convergent lens that converges the formed beam, 15 to a deflector for shaping, 16 to a first mask deflector, 17 to a deflector that dynamically compensates for the astigmatism of a mask, 18 to a second mask deflector, 19 to a convergent coil for a mask, 20 to a first shaping lens, 21 to a block mask moved by a stage 21A, 22 to a second shaping lens, 23 to a third mask deflector, 24 to a blanking deflector for on/off control of the beam, 25 to a fourth mask deflector, 26 to a third shaping lens, 27 to a circular aperture, 28 to a reducing lens, 29 to a focus coil, 30 to a projection lens, 31 to an electromagnetic main deflector, 32 to an electrostatic sub-deflector, and 33 to a reflected electron detector that detects an electron radiated onto a specimen and reflected thereby, and a unit that includes all the parts mentioned above is called an electronic optical lens barrel (column). The electron beam 10 from the column is radiated toward a specimen (wafer) 1 placed on the stage 2. The stage moves the wafer 1 two-dimensionally in a plane perpendicular to the electron beam 10. The electron beam exposure apparatus is further equipped with an exposure control portion that controls each portion of the column in order to expose a desired pattern.

FIG. 2 illustrates the block mask 21 mentioned above. The block mask 21 looks like a silicon substrate such as a wafer, and the block mask area where an actual aperture pattern is formed is machined by etching or the like so that the depth is about 20 μm. In the block mask area, plural aperture patterns 61 are arranged in a matrix form as shown in the figure. The range in which the electron beam is deflected by the mask deflector to select the aperture pattern 61 is limited, and the size of the block mask area is determined accordingly. Each aperture pattern 61 has apertures 62 corresponding to the unit pattern of a repetitive figure. Though each aperture pattern 61 has different aperture patterns generally, plural apertures of the same shape are provided when the aperture pattern is used frequently. When a pattern is comprised of a combination of unit patterns only, it can be drawn by selecting and exposing the aperture pattern 61. Generally it is difficult, however, to form a pattern using only unit patterns, therefore, an aperture pattern 61 consisting of an entire aperture is provided so that any pattern can be drawn by shaping the electron beam that has passed using a variable rectangle method.

Moreover, plural block mask areas are provided on a block mask and the block mask area to be used can be changed by moving the block mask 21 by the stage 21A. This is because the aperture pattern may be damaged due to radiation by an electron beam over time.

To select the aperture pattern 61, the beam is deflected by the first mask deflector 16 according to the position of the aperture pattern 61 to be selected, then the beam is made parallel again with the optical axis by the second mask deflector 18, and put into the selected aperture pattern 61 perpendicularly. The beam that has passed through the selected aperture pattern 61 is deflected by the third mask deflector 23 so as to return to the optical axis, and the beam returned to the optical axis is deflected by the fourth mask deflector 25 so as to be made parallel to the optical axis. That is, the second mask deflector 18 and the third mask deflector 23 deflect the beam by the same amount but in the opposite direction as that of the first mask deflector 16, and the fourth mask deflector 25 deflects the beam by the same amount as that of the first mask deflector 16.

FIGS. 3A through 3C illustrate the size of the beam compared with the aperture pattern 61 and the influence of the deviation of the deflection position.

As shown in FIG. 3A, plural square aperture patterns 61 are arranged in a matrix form on the block mask 21. In addition to squares, rectangles may be used. The deflected beam passes through one of the plural aperture patterns 61, but a beam of large size may pass through an aperture of other proximate aperture patterns. Furthermore, an error of the deflection amount by the first mask deflector 16 may also cause the beam to pass through an aperture of other proximate aperture patterns similarly. To prevent this, the beam is made to be about the same size as the aperture pattern 61, a maximum aperture area circumscribed by a broken line is provided to the aperture pattern 61, and the aperture is formed within this maximum aperture area. This will prevent the beam from passing through an aperture of other proximate apertures as long as the deviation of the deflection position is small. For example, if the length of a side of the square aperture pattern 61 is P and that of a side of the maximum aperture area, which is arranged in the center of the aperture pattern 61, is Q, then the distance R between the side of the aperture pattern 61 and that of the maximum aperture area is (P−Q)/2. As shown in FIG. 3B, the beam does not pass through an aperture of other proximate aperture patterns as long as the error of the beam position is within ±R.

Since there is actually an error of the beam size, and the intensity at the edges changes gradually, it is preferable to adjust the side of the beam so as to be smaller than that of the aperture pattern 61.

As shown in FIG. 3C, however, the distribution of intensity is not uniform in the beam, and the intensity is the strongest in the center and it becomes weaker at the peripheral portion. Therefore, there exists the difference S in intensity even though the deflection position of the beam is correct and the center of the beam coincides with that of the aperture pattern 61. This difference S in intensity causes the variations in amount of exposure. Therefore, a beam with small variation is generated, and the sizes of the beam and aperture pattern, and the maximum aperture area, are determined with the variation being taken into account.

As mentioned above, due to the variation in the beam intensity, a portion of the beam with rather weak intensity may pass through the maximum aperture area of the selected aperture pattern, and the variation of the beam becomes larger after it passes through the aperture, if the position of the beam is deviated. Therefore, it is necessary to deflect the beam to the correct position of the selected aperture pattern, and to make the error in the deflection position as small as possible.

The first mask deflector 16 to select an aperture pattern of the block mask and the second through the fourth deflectors 18, 23, and 25 to cancel the deflection are generally of the electrostatic deflector type. The amount of deflection by the electrostatic deflector changes according to the voltage applied, but not in perfect proportion. Conventionally, the deflection characteristic of the first mask deflector 16 is measured and, based on the measured deflection characteristic, the voltage to be applied to the first mask deflector 16 is determined for each aperture pattern, and each deflection amount of the second through the fourth deflectors is determined accordingly. During exposure, a voltage calculated and determined according to the aperture pattern to be selected is applied.

In this manner, however, a problem in that the error is considerably large and the variation of beam intensity in the pattern is also large, when the aperture pattern is actually selected, occurs.

Conventionally, the maximum aperture area is, therefore, made relatively small compared with the aperture pattern to prevent the variation from increasing even when the beam is deviated. This measure, however, poses a limit to the size of the maximum aperture area and, therefore, to the size of a pattern to be exposed in one shot. Moreover, when the maximum aperture area is made large enough, it is necessary to enlarge the aperture pattern, resulting in the problem that the number of the aperture patterns that can be arranged in the area in which the beam can be deflected by the mask deflector, that is the number of the aperture patterns of the block mask, is reduced.

Because of the facts mentioned above, it is required to deflect a beam to the correct position using the mask deflector for each aperture pattern, and to realize this, it is also necessary to precisely measure the position of the beam deflected by the mask deflector in relation to that of each aperture pattern and, based on the measurement result, the voltage to be applied to the first mask deflector 16 for each aperture pattern should be determined, and the amounts of deflection by the second through the fourth deflectors should be also determined accordingly.

SUMMARY OF THE INVENTION

It is the purpose of the present invention to precisely determine the amount of deflection by the mask deflector for each aperture pattern by precisely measuring the relative position between the beam deflected by the mask deflector and individual aperture patterns.

To realize this purpose, according to the adjusting method of the electron beam exposure apparatus of the present invention, a block mask having at least one adjusting aperture pattern equipped with independent aperture patterns of the same shape arranged along the opposite sides of the maximum aperture area is provided, and the mask deflector is adjusted so that the intensity of the beam, which is radiated onto the specimen, at the portion of the independent apertures of the same shape arranged along the opposite sides of the adjusting aperture pattern, is uniform and maximum.

The adjusting method of the electron beam exposure apparatus of the present invention, which can be used in an electron beam exposure apparatus that has the ability to expose the patterns corresponding to the selected aperture patterns at one time, comprising an electron gun that generates an electron beam, a block mask equipped with plural aperture patterns, mask deflectors to deflect the electron beam so that it passes through one of the said plural aperture patterns selectively, and also to deflect the passed electron beam so that it returns to its original path, convergent devices that converge the electron beam that has passed through the block mask onto a specimen, and deflectors that deflect the said electron beam on the specimen, is characterized in that the mask deflector is adjusted so that the intensity of the beam, which is radiated at the specimen, at the portion of the independent apertures of the same shape arranged along the opposite sides of the adjusting aperture pattern is uniform and maximum in the electron beam exposure apparatus, wherein: the plural aperture patterns are squares or rectangles, and arranged in a matrix form; each aperture pattern has the square or rectangular maximum aperture area that limits the area in which an aperture is formed; and a block mask having at least one adjusting aperture pattern equipped with independent apertures of the same shape arranged along the opposite sides of the maximum aperture area.

The intensity of the beam which is radiated onto the specimen, at the portion of the aperture of the adjusting aperture pattern, is measured by deflecting the electron beam shaped into the adjusting aperture pattern using a deflection means and by detecting the reflected electrons when the fine lines along the sides of the maximum aperture area provided on the specimen are scanned.

When adjustment of the mask deflector is conducted for all of the adjusting aperture patterns, all of the plural aperture patterns of the block mask should be treated as the adjusting aperture patterns.

When adjustment of the mask deflector is conducted for only the aperture patterns located on the central and peripheral portions, and an interpolation is applied for other aperture patterns, a block mask on which adjusting aperture patterns are arranged only in the central and peripheral portions is used.

According to the present invention, the aperture portions of the adjusting aperture pattern correspond to the independent apertures of the same shape arranged along the opposite sides of the maximum aperture area, therefore, the variation of the beam that has passed through the maximum aperture area is the smallest when the intensity at these two apertures is adjusted to be the same.

BRIEF DESCRIPTION OF THE DRAWINGS

The features and advantages of the invention will be more clearly understood from the following description taken in conjunction with the accompanying drawings in which:

FIG. 4 illustrates the configuration of the block mask, the mask deflectors, and the drive circuits of the electron beam exposure apparatus in the embodiment of the present invention;

DESCRIPTION OF THE PREFERRED EMBODIMENTS

Figure 1:
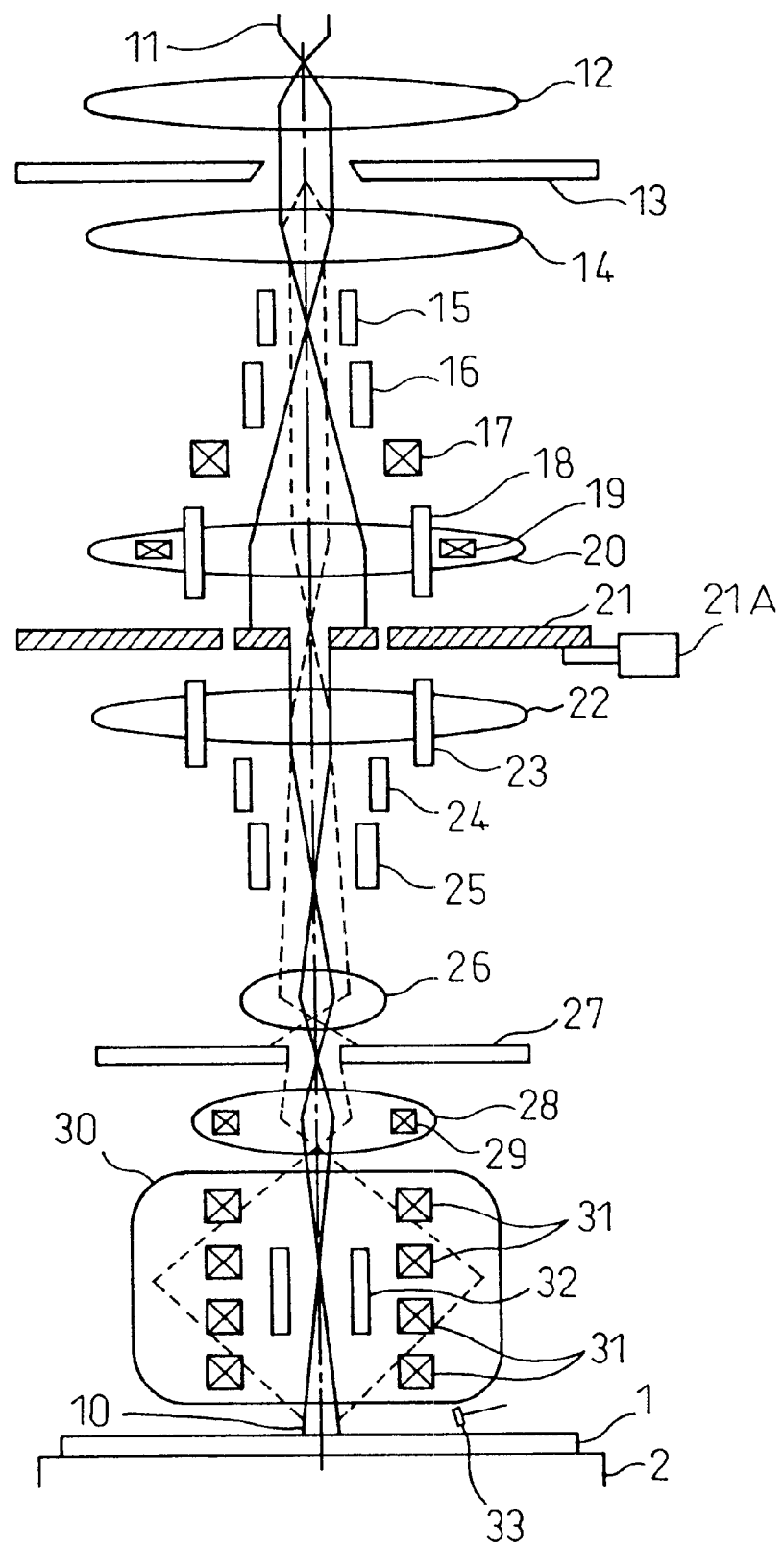
FIG. 1 illustrates a configuration of an electronic optical column of an electron beam exposure apparatus.
Figure 2:
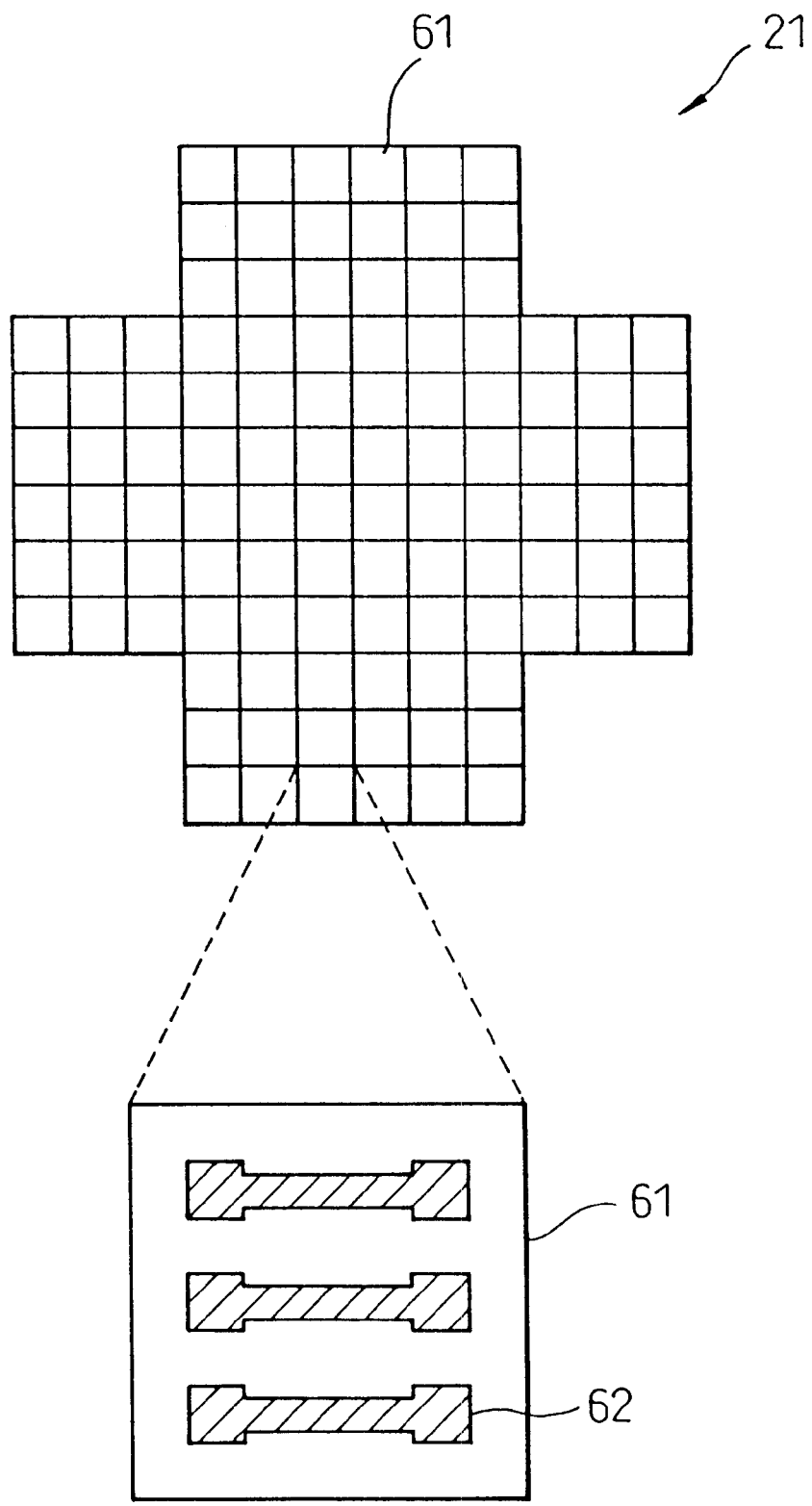
FIG. 2 illustrates a block mask for an electron beam exposure apparatus.
Figure 3A:
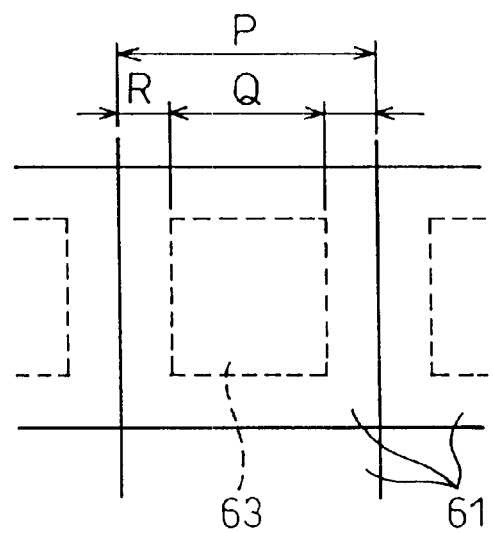
FIGS. 3A through 3C illustrate the deflection position of the beam relative to the electron beam exposure apparatus block mask.
Figure 3B:
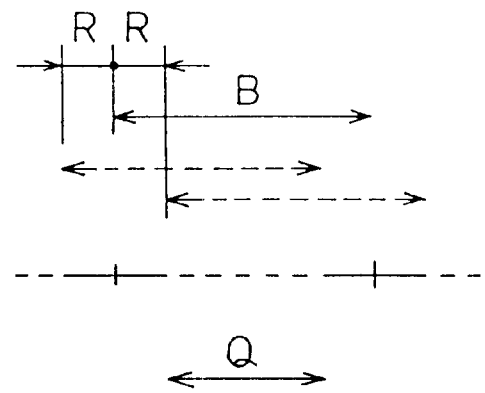
Figure 3C:
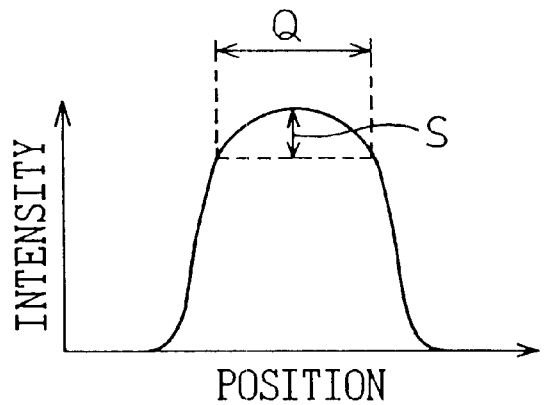

The electron beam exposure apparatus in the embodiment of the present invention has almost the same configuration as the conventional ones as shown in FIG. 1. FIG. 4 illustrates the block mask 21, the first through the fourth mask deflectors 16, 18, 23, and 25, and related drive circuits of the electron beam exposure apparatus.

The CPU 41 reads out the drawing data stored in the magnetic tape 42 and the magnetic disc 43 via the bus 44, and sends out the data relating to the selection of a block mask, which is generated from the drawing data, to the exposure control portion 45. The CPU 41 also generates deflection data for the main deflector 31 and sub-deflector 32 and focus data for the focus coil 29, and sends them to each drive circuit, though an explanation is not provided here. The deflection position data relating to the block mask selection sent from the CPU 41 via the bus 44 is provided to the exposure control portion 45 via the interface 46. The lookup table 47 stores the signal values (output values) to be applied to the drive circuits of each mask deflector 16, 18, 23, and 25, and the deflector 17 according to the deflection position data. The exposure control portion 45 reads out the output value corresponding to the specified aperture pattern and sends it to the drive circuit 48 consisting of a D/A converter (DAC) and amplifier (AMP). The DAC/AMP circuit 48 generates an analog signal corresponding to the output value and applies it to the first through the fourth mask deflectors 16, 18, 23, and 25, and the deflector 17. A block mask is thus selected in the manner described above.

In the present embodiment, the following measurement and adjustment are carried out after the abovementioned settings are completed.

Figure 5A:
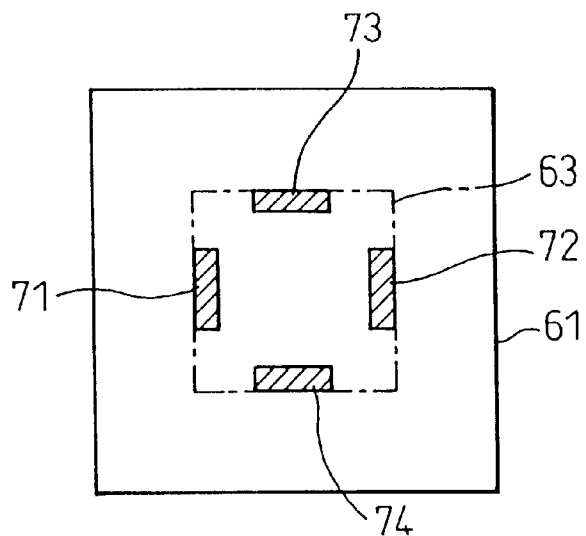
FIGS. 5A through 5C illustrate examples of adjusting aperture patterns used in the embodiment.
Figure 5B:
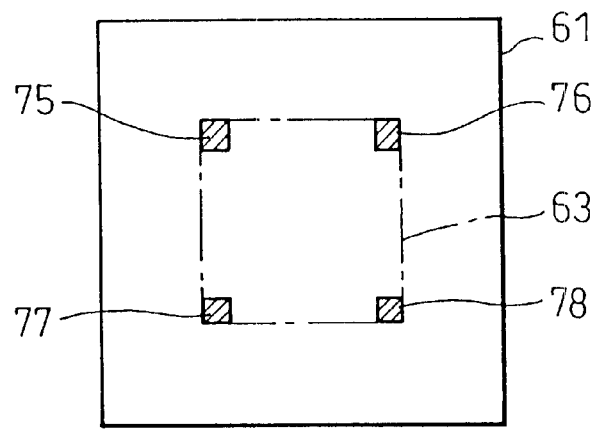
Figure 5C:
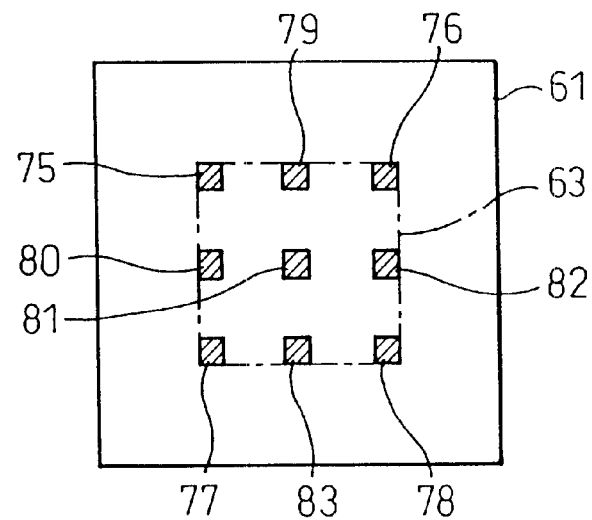

First of all, a block mask 21 in which all aperture patterns 61 include the adjusting aperture patterns as shown in FIGS. 5A through 5C is provided. Each adjusting aperture pattern has independent apertures of the same shape arranged along the opposite sides of the maximum aperture area 63. In FIG. 5A, for example, there are four rectangular apertures 71 to 74 arranged along each side of the maximum aperture area 63. The rectangular apertures 71 and 72 arranged along the opposite sides have the same shape and so do the apertures 73 and 74. In this case, the shapes of apertures 71 and 72 coincide with those of the apertures 73 and 74, respectively, after a rotation of 90 degrees. In FIG. 5B, there are four square apertures 75 to 78 in each corner of the maximum aperture area 63, and in FIG. 5C, there are five more square apertures 79 to 83 of the same shape, four at the middle of each side, and one in the center of the maximum aperture area 63, in addition to the apertures in FIG. 5B. The pattern shown in FIG. 5A is used here for explanation, though any pattern is possible.

Figure 6A:
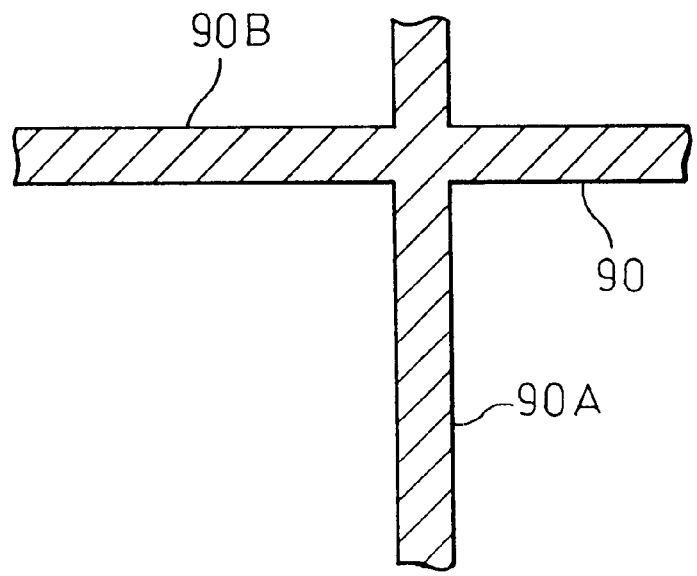
FIGS. 6A and 6B illustrate a shifted (embossed or etched) pattern on a specimen to be used in the embodiment and the measuring operation using this pattern.

FIG. 6A illustrates the fine line 90 provided on the specimen (wafer) 1 to be used for measurement. A shifted (embossed or etched) pattern, in which the fine line 90 is made higher or lower than another part, is placed on the specimen 1. The fine line 90 has the line 90A that extends in the Y direction and the line 90B that extends in the X direction. When the specimen 1 that has a shifted pattern 90 as shown in FIG. 6A is scanned by the electron beam 10, the amount of the reflected electron while the electron beam traverses the pattern 90 increases and the increment can be detected by the reflected electron detector 33 shown in FIG. 1.

Figure 6B:
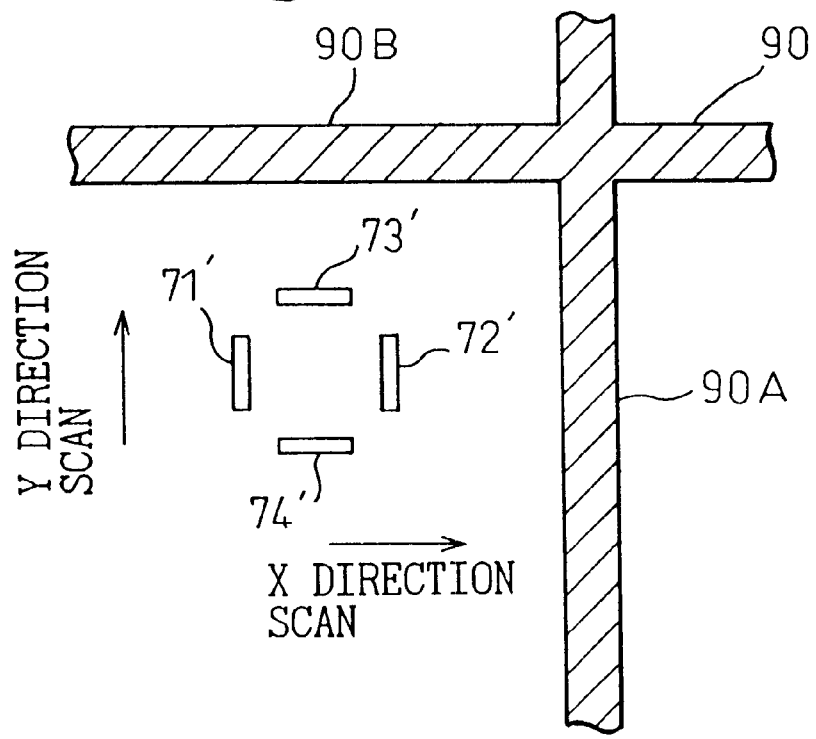

An electron beam shaped into the adjusting aperture pattern in FIG. 5A is radiated onto the specimen after each line of the fine line 90 is adjusted to extend in the X and Y directions, respectively, as shown in FIG. 6B. At this time, the sides of the rectangular electron beam patterns 71' to 74' corresponding to the apertures 71 to 74 are adjusted so that they are parallel to the line 90A and line 90B, respectively. Then, the sub-deflector 32 is used to scan in the X and Y directions and the output of the reflected electron detector 33 is observed.

Figure 7A:
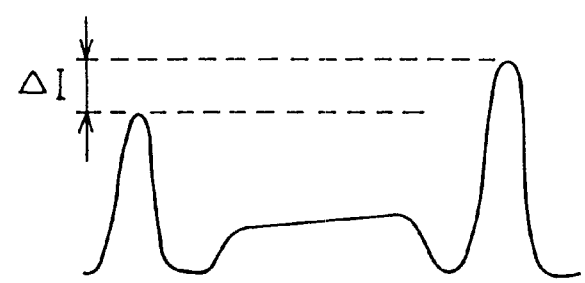
FIGS. 7A and 7B illustrate an example of the variation of reflected electron signal observed in the embodiment and a related adjusting method.
Figure 7B:
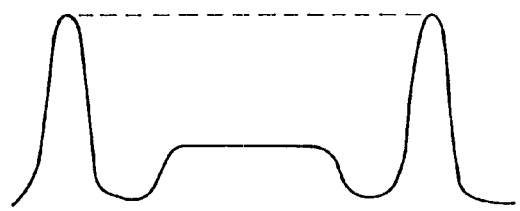

FIGS. 7A and 7B illustrate examples of the variations in the detected signal when scanned in the X direction. FIG. 7A shows two high peaks corresponding to the patterns 71' and 72', and a low and wide peak corresponding to the patterns 73' and 74'. The difference in height between the two peaks on both ends indicates the difference in intensity and it can be concluded that the position of the selected adjusting aperture pattern is different from that of the beam deflected by the mask deflector. Therefore, it is necessary to conduct the observation similarly with another adjusting value in the lookup table 47 in FIG. 4 until the two peaks have the same height as shown in FIG. 7B. At the same time, the value should be selected so that the height of the peaks is as high as possible. Similarly, the same adjustment is applied in the Y direction. The abovementioned adjustment will optimize the positions of the selected adjusting aperture pattern and the deflected beam.

The optimum deflection for each aperture pattern can be obtained by applying the abovementioned adjustment to other adjusting aperture patterns of the block mask.

In the manufacturing process of the electron beam exposure apparatus, a block mask 21 consisting only of adjusting aperture patterns is used to adjust the deflection position for each aperture pattern. Since the adjusted deflection amount may change with time, periodical checks and modifications are required. In this case, however, it is not necessary to check all the aperture patterns, instead, just taking measurement of only several central and peripheral aperture patterns and correcting the deviation using interpolation will do.

Figure 8:
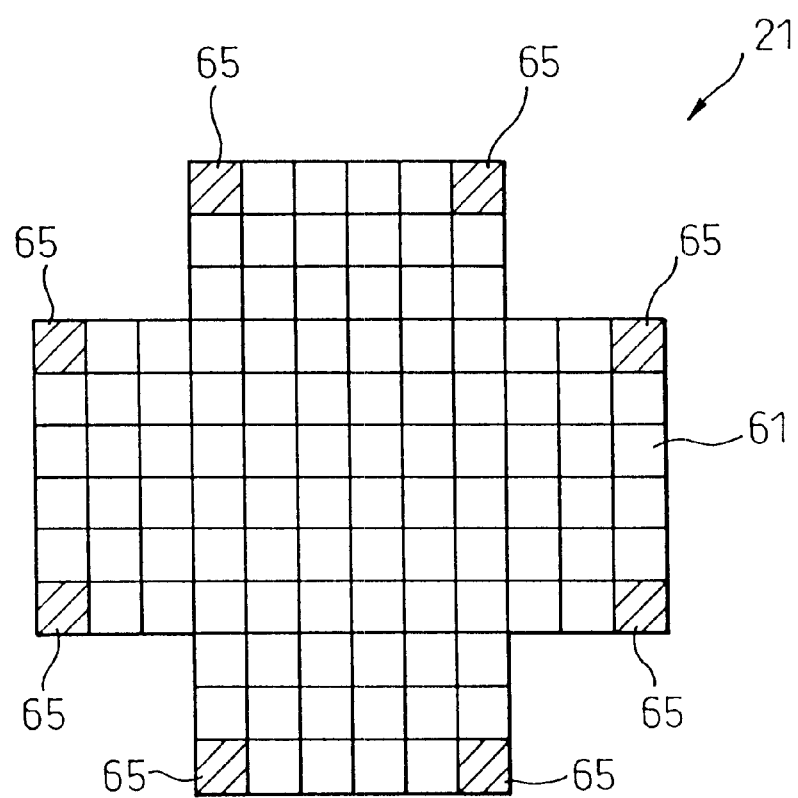
FIG. 8 illustrates another example of an electron beam exposure apparatus block mask for adjusting the mask deflector.

The block mask 21 consisting only of adjusting aperture patterns can also be used for the abovementioned periodical checks and modifications. It is, however, necessary to change the block mask each time, making the work more troublesome. Therefore, it is advisable to use a block mask shown in FIG. 8. This block mask 21 has adjusting aperture patterns only at the aperture patterns 65 diagonally hatched and other aperture patterns are the normal ones that can be used with a normal optical exposure. If a block mask 21 like this is used, checks and adjustments can be conducted without replacement of the block mask 21.

As explained above, the present invention can provide a precise amount of deflection of the mask deflector according to each aperture pattern because the difference in position between the beam deflected by the mask deflector and each aperture pattern is measured precisely. This not only realizes an exposure with high accuracy and without exposure variation, but also increases the efficiency by increasing the number of the aperture patterns formed on the block mask.

I claim:

1. An electron beam exposure apparatus that has the ability to expose patterns corresponding to the selected aperture patterns, at one time, comprising an electron gun that generates an electron beam, a block mask equipped with plural aperture patterns, mask deflectors to deflect the said electron beam so that it passes selectively through one of the said plural aperture patterns, and also to deflect the said passed electron beam so that it returns to its original path, convergent devices that converge the said electron beam that has passed through the said block mask onto a specimen, and deflectors that deflect the said electron beam on the said specimen, wherein:

the said plural aperture patterns are square or rectangular and arranged in a matrix form, and each aperture pattern has a square or rectangular maximum aperture area that limits the area in which each aperture is formed;

the said block mask having at least one adjusting aperture pattern equipped with independent apertures of the same shape arranged along the opposite sides of the said maximum aperture area is provided; and the said mask deflector is adjusted so that the intensity of the beam, which is radiated onto the said specimen, at the portion of the independent apertures of the same shape arranged along the opposite sides of the said adjusting aperture pattern, is uniform and maximum;

wherein, the electron beam entering onto the block mask has a size covering the maximum aperture area and passes simultaneously through each of the independent apertures.

2. An electron beam exposure apparatus as set forth in claim 1, wherein, the intensity of the beam, which is radiated onto the said specimen, at the portion of the said apertures of the said adjusting aperture patterns, is measured by deflecting the electron beam shaped into the said adjusting aperture patterns using the said deflection means and by detecting the reflected electron when the fine lines on the specimen, along the sides of the said maximum aperture area, are scanned.

3. An adjusting method of an electron beam exposure apparatus, which can be used in an electron beam exposure apparatus that has the ability to expose the patterns corresponding to the selected aperture patterns at one time, comprising an electron gun that generates an electron beam, a block mask equipped with plural aperture patterns, mask deflectors to deflect the said electron beam so that it passes selectively through one of the said plural aperture patterns, and also to deflect the said passed electron beam so that it returns to its original path, convergent devices that converge the said electron beam that has passed through the said block mask onto a specimen, and deflectors that deflect the said electron beam on the said specimen, wherein:

the said plural aperture patterns are square or rectangular and arranged in a matrix form, and each aperture pattern has a square or rectangular maximum aperture area that limits the area in which each aperture is formed; and the adjustment of the said mask deflectors is carried out so that the block mask having at least one adjusting aperture pattern equipped with independent apertures of the same shape arranged along the opposite sides of the said maximum aperture area is provided and that the intensity of the beam, which is radiated onto the said specimen, at the portion of the apertures of the same shape arranged along the opposite sides of the said adjusting aperture patterns, is adjusted so as to be uniform and maximum;

wherein, the electron beam entering onto the block mask has a size covering the maximum aperture area and passes simultaneously through each of the independent apertures.

4. An adjusting method of an electron beam exposure apparatus as set forth in claim 3, wherein the intensity of the beam, which is radiated onto the said specimen, at the portion of the apertures of the said adjusting aperture patterns is measured by deflecting the electron beam shaped into the said adjusting aperture patterns using the said deflection means and by detecting the reflected electrons when the fine lines, on the specimen along the sides of the said maximum aperture, area are scanned.

5. An adjusting method of an electron beam exposure apparatus as set forth in claim 3, wherein:

the said block mask consists only of the said adjusting aperture patterns; and the adjustment of the said mask deflectors is carried out on all of the said adjusting aperture patterns.

6. An adjusting method of an electron beam exposure apparatus as set forth in claim 3, wherein:

the said adjusting aperture patterns are arranged in the central and peripheral portions of the plural aperture patterns of the said block mask; and the adjustment of the said mask deflectors is carried out for the said plural adjusting aperture patterns.

* * * * *

UNITED STATES PATENT AND TRADEMARK OFFICE
CERTIFICATE OF CORRECTION

PATENT NO. : 6,573,519 B1
DATED : June 3, 2003
INVENTOR(S) : Akio Takemoto

It is certified that error appears in the above-identified patent and that said Letters Patent is hereby corrected as shown below:

Column 8,
Line 38, insert -- , -- after "specimen"
Line 39, replace "aperture, area" with -- aperture area, --

Signed and Sealed this

Twenty-eighth Day of September, 2004

JON W. DUDAS
*Director of the United States Patent and Trademark Office*